United States Patent
Schwamb et al.

(10) Patent No.: US 9,490,452 B2
(45) Date of Patent: Nov. 8, 2016

(54) LIGHT-EMITTING ORGANIC COMPONENT

(71) Applicant: OSRAM OLED GmbH, Regensburg (DE)

(72) Inventors: Philipp Schwamb, Regensburg (DE); Daniel Steffen Setz, Boeblingen (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/409,455

(22) PCT Filed: Jun. 5, 2013

(86) PCT No.: PCT/EP2013/061613
§ 371 (c)(1),
(2) Date: Dec. 18, 2014

(87) PCT Pub. No.: WO2014/001046
PCT Pub. Date: Jan. 3, 2014

(65) Prior Publication Data
US 2015/0194632 A1    Jul. 9, 2015

(30) Foreign Application Priority Data

Jun. 26, 2012 (DE) .................. 10 2012 210 876

(51) Int. Cl.
*H01L 29/08* (2006.01)
*H01L 51/52* (2006.01)
*H01L 51/50* (2006.01)

(52) U.S. Cl.
CPC ......... *H01L 51/5262* (2013.01); *H01L 51/504* (2013.01); *H01L 51/5268* (2013.01); *H01L 51/5271* (2013.01); *H01L 51/5275* (2013.01)

(58) Field of Classification Search
CPC .......... H01L 51/5275; H01L 51/5271; H01L 51/5268; H01L 51/5262
See application file for complete search history.

(56) References Cited

U.S. PATENT DOCUMENTS

| 2011/0070456 A1* | 3/2011 | Philippens | H01L 51/0097 428/523 |
| 2012/0176789 A1* | 7/2012 | Van Herpen | F21V 21/0808 362/234 |
| 2012/0212127 A1* | 8/2012 | Kakiuchi | H01L 51/0096 313/504 |

FOREIGN PATENT DOCUMENTS

| DE | 102006060781 A1 | 4/2008 |
| DE | 102008031533 A1 | 1/2010 |
| DE | 102009051962 A1 | 5/2011 |

(Continued)

OTHER PUBLICATIONS

Microlens—Wikipedia, the free encyclopedia: <http://en.wikipedia.org/wiki/Microlens#Fabrication>, (May 6, 2012).

*Primary Examiner* — Khiem D Nguyen
(74) *Attorney, Agent, or Firm* — McDermott Will & Emery LLP (57) ABSTRACT

A light-emitting organic component is specified, comprising—an organic active region (3), in which light is generated during the operation of the component, and—an uneven light exit surface (6), through which at least part of the light generated in the organic active region (3) emerges from the component, wherein—a multiplicity of optical structures (7) which optically influence the light passing through and/or impinging on them are arranged at the uneven light exit surface (6).

13 Claims, 5 Drawing Sheets

(56) References Cited

FOREIGN PATENT DOCUMENTS

| DE | 102010038363 | A1 | | 1/2012 | |
| DE | 102010063608 | A1 | | 6/2012 | |
| WO | 2011/074491 | A1 | | 6/2011 | |
| WO | WO-2012084840 | | * | 6/2012 | ............. H01L 51/52 |

* cited by examiner

LIGHT-EMITTING ORGANIC COMPONENT

SUMMARY

A light-emitting organic component is specified.

One object to be achieved is to specify a light-emitting organic component which can be operated particularly efficiently.

In accordance with at least one embodiment of the light-emitting organic component, the component comprises an organic active region. Light is generated in the organic active region of the light-emitting organic component during the operation of the component. For this purpose, the active region contains at least one organic material. In this case, it is possible for colored light or white light to be generated in the active region.

The light-emitting organic component can furthermore comprise a plurality of organic active regions, which can be arranged for example in a manner spaced apart with respect to one another in a lateral direction.

The active region can comprise layers comprising organic polymers, organic oligomers, organic monomers, organic small, non-polymeric molecules ("small molecules") or combinations thereof. In particular, it can be advantageous if the active region comprises a functional layer embodied as a hole transport layer, in order to enable effective hole injection into the light-emitting layer. By way of example, tertiary amines, carbazole derivatives, conductive polyaniline or polyethylene dioxythiophene can prove to be advantageous as materials for a hole transport layer. Materials which exhibit radiation emission on account of fluorescence or phosphorescence, for example polyfluorene, polythiophene or polyphenylene or derivatives, compounds, mixtures or copolymers thereof, are suitable as materials for the light-emitting layer. Furthermore, the active region can comprise an organic functional layer embodied as an electron transport layer. Furthermore, the layer stack can also comprise electronic and/or hole blocking layers.

The light-emitting organic component is, in particular, an organic light-emitting diode (OLED) distinguished by a relatively large light emission surface at which light emerges from the light-emitting organic component.

In accordance with at least one embodiment of the light-emitting organic component, the component comprises a non-planar light exit surface, through which at least part of the light generated in the organic active region emerges from the component. The light exit surface is formed for example by one main surface of the component. Furthermore, it is possible for two main surfaces of the light-emitting organic component to be embodied as light exit surfaces. The light-emitting organic component is then a component which can emit light from two opposite surfaces.

The light exit surface or the light exit surfaces of the light-emitting organic component are embodied in a non-planar fashion. That is to say that the light exit surface has a curvature and/or bends. In this case, the light exit surface is preferably embodied as smooth—within the scope of the production tolerance. By way of example, the light exit surface is formed by a concavely or convexly curved surface which outwardly delimits the light-emitting organic component. However, the light exit surface can also be an imaginary surface. That is to say that the non-planar light exit surface can be for example an imaginary surface composed of a plurality of planar light exit surfaces. Furthermore, it is possible for the non-planar light exit surface to be that smooth surface which is disposed upstream of a structuring of the light exit surface in the passage direction of the light through the light exit surface. The actual outer surface of the light-emitting organic component, through which the light generated in the active region at least partly leaves the component, can then have structures and is not embodied as smooth. The structures are then superimposed on or disposed downstream of the non-planar, imaginary light exit surface.

In accordance with at least one embodiment of the light-emitting organic component, the component comprises a multiplicity of optical structures at the non-planar light exit surface, said multiplicity of optical structures being arranged at the non-planar light exit surface. That is to say that structures which optically influence the light impinging on them and/or which optically influence the light passing through them are arranged for example directly at the non-planar light exit surface.

Furthermore, it is possible for the optical structures to be optically connected to the light exit surface via an optically low refractive index material or an air gap. The optically low refractive index material has for example a refractive index for the radiation generated in the component of less than 1.5 or less than 1.4, or less than 1.2, in particular of approximately equal to 1 or equal to 1.

In this case, the optical structures can be applied for example to the outer surface of the component at the light exit surface, for example by the fitting of a secondary-optical foil, in particular by adhesive bonding only in an edge region of the light exit surface, outside the active surface.

Furthermore, it is possible for the optical structures to be introduced into the material delimiting the organic component at the outer surface. The optical structures are then superimposed on the basic form of the smooth, non-planar light exit surface.

By way of example, the non-planar light exit surface can have the form of a circle segment or a parabola. The smaller optical structures are then superimposed on the circle segment or the parabola. If the optical structures are embodied for example by wavy or lens-shaped embossings into the material of the outer surface of the component at the non-planar light exit surface, then it is possible for a light exit surface embodied overall in a concave or convex fashion to have convex or concave partial regions on a smaller size scale than the size scale of the non-planar light exit surface.

In accordance with at least one embodiment of the light-emitting optical component, the light-emitting optical component comprises an organic active region, in which light is generated during the operation of the component, and a non-planar light exit surface, through which at least part of the light generated in the organic active region emerges from the component, wherein a multiplicity of optical structures are arranged at the non-planar light exit surface and optically influence the light passing through and/or impinging on them.

It has been found that, by way of example, the light distribution characteristic of flat light-emitting organic components, for example of flat OLED surface emitters, can be influenced only to a limited extent without the use of special secondary optical systems. The shaping of organic light-emitting diodes, for example, in such a way that the organic light-emitting diode has a non-planar light exit surface, allows the light distribution curve thereof to be influenced over a large range, potentially even dynamically. With the use of smooth light exit surfaces, however, it is found that, without further measures, large losses of efficiency should be expected for components with non-planar light exit surfaces.

It has been found, then, that the use of optical structures at a non-planar light exit surface, which optical structures optically influence the light passing through and/or impinging on them, can contribute to increasing the efficiency of a light-emitting organic component with a non-planar light exit surface.

In accordance with at least one embodiment of the light-emitting organic component, the non-planar light exit surface is a curved surface. In particular, the non-planar light exit surface in this case is provided by a single curved surface. By way of example, the light-emitting organic component is a large-area light-emitting organic component having a convexly and/or a concavely curved light exit surface. In particular, it is possible for the component in this case to comprise a single organic active region extending over the entire cross section of the component. Light generated in the organic active region then emerges from the component through the non-planar light exit surface embodied as a curved surface.

In accordance with at least one embodiment of the light-emitting organic component, the non-planar light exit surface comprises at least two planar partial surfaces. In this case, it is possible for the light-emitting organic component to comprise two or more organic active regions. In this case, each organic active region can be assigned one of the planar partial surfaces. In other words, the light-emitting organic component in this case comprises for example a multiplicity of light-emitting organic elements, for example OLEDs, which each have at least one planar light exit surface, which respectively form one of the planar partial surfaces of the light exit surface of the component. The planar partial surfaces are then arranged in such a way that they run at least partly obliquely with respect to one another. That is to say that at least one planar partial surface is not arranged in a coplanar fashion with respect to the other planar partial surfaces, but rather runs obliquely with respect to at least one further planar partial surface.

The planar partial surfaces can be arranged alongside one another for example in such a way that they simulate or approximate a concavely or convexly running light exit surface by means of planar segments.

In accordance with at least one embodiment of the light-emitting organic component, the light-emitting organic component comprises at least two organic active regions, wherein each organic active region is assigned a planar partial surface. In this case, it is possible for each organic active region to have two planar partial surfaces which are situated opposite one another and through which light of the assigned organic active region emerges. In this case, it is possible, in particular, for the two organic active regions to be drivable independently of one another. Furthermore, it is possible for light of different colors to be generated in two different organic active regions.

By way of example, each of the organic active regions is part of a dedicated organic element, for example of an OLED, which forms at least one planar light exit surface which forms the planar partial region of the overall non-planar light exit surface of the light-emitting organic component.

In accordance with at least one embodiment of the light-emitting organic component, light emerging from a first region of the non-planar light exit surface is emitted in the direction of a second region of the non-planar light exit surface. That is to say that, on account of the non-planar light exit surface, light which emerges from the non-planar light exit surface in a first region illuminates a second region of the non-planar light exit surface, and vice-versa if appropriate. In the case of the light-emitting organic component, therefore, a so-called self-illumination occurs on account of the non-planarity of the light exit surface. This self-illumination can lead to a loss of efficiency of the light-emitting organic component, since the intrinsic light for example can be absorbed in the light-emitting organic component or is only partly reflected, such that self-shading occurs.

In accordance with at least one embodiment of the light-emitting organic component, light emerging from a first region of the non-planar light exit surface is emitted in the direction of a second region of the non-planar light exit surface and is directed away from the non-planar light exit surface by optical structures in the second region.

In other words, the light from the self-illumination is redirected preferably with simultaneous minimization of absorption of this light at the light exit surface, such that it is emitted from the light-emitting organic component and not absorbed there. By way of example, the optical structures in this case can be prisms arranged at the light exit surface. In this case, the shaping can vary along the light exit surface, such that the form of the prisms is reflected locally to the angular range from which light impinges on the optical structure.

In accordance with at least one embodiment of the light-emitting organic component, an angular distribution of the intensity and/or of the color of the light emitted by the non-planar light exit surface is set by the optical structures.

That is to say that the optical structures can already influence properties of the emerging light in the course of emergence from the component. In this case, by way of example, the angular distribution of the intensity of the emerging light can be varied. In this case, the angular distribution can be wider or narrower than without an optical structure.

Furthermore, it is possible for the optical structures to correct aberrations of the color of the emerging light which occur on account of the non-planar light exit surface. By way of example, if white light is generated in the organic active region, then it is possible that—on account of the non-planar configuration of the light exit surface—chromatic aberrations are visible at the light exit surface since the emerging light is perceived by the observer at different locations of the light exit surface at different angles. The non-planar light exit surface can therefore emit white light in its center, for example, whereas the light emerging at the edges has a color cast. This so-called color angle distortion can be corrected by the optical structures, thereby improving the light quality of the light emitted by the light-emitting organic component during operation.

In accordance with at least one embodiment of the light-emitting organic component, an angular distribution of the intensity and/or of the color of the light emitted by the non-planar light exit surface is varied along the non-planar light exit surface. That is to say that, at different locations of the light exit surface, the optical structures are embodied differently with respect to one another, thus resulting in different optical influencing.

In accordance with at least one embodiment of the light-emitting organic component, the angular distribution of the intensity of the light emitted by the non-planar light exit surface becomes narrower toward the edges of the non-planar light exit surface, in such a way that a self-illumination of the light exit surface is at least reduced. The narrower angular distribution at the edges ensures that less light is emitted in the direction of the center of the non-planar light exit surface. The self-illumination described above can therefore be reduced in this way.

In accordance with at least one embodiment of the light-emitting organic component, a main emission direction of the light emitted by the non-planar light exit surface is set by the optical structures and varied along the non-planar light exit surface. By way of example, the main emission direction, that is to say the direction in which the emitted light has the greatest intensity locally on the light exit surface, can be perpendicular to the light exit surface in the center of the light exit surface. At the edges, the main emission direction can run at an angle of less than or greater than 90° with respect to the light exit surface, in such a way that a self-illumination of the light exit surface is at least reduced. That is to say that the main emission direction can be varied in such a way that a self-illumination of the light exit surface is at least reduced.

In accordance with at least one embodiment of the light-emitting organic component, the light-emitting organic component comprises at least one of the following optical structures: prism, lens, scattering center.

Optical elements such as prisms make it possible for the optical structures to direct away from the light exit surface light from the self-illumination that impinges on them, such that less or no absorption of this light occurs.

Optical elements such as lenses make it possible for emerging light to be set in terms of its angular distribution and/or its main emission direction in such a way that the probability of self-illumination of the light exit surface is reduced.

Optical elements such as light-scattering structures firstly make it possible to increase a probability of emergence for light at the non-planar light exit surface, and secondly make it possible for a large portion of the light from the self-illumination to be directed away from the light exit surface diffusely in this way.

Overall, the optical structures arranged at the non-planar light exit surface can be used both for avoiding or reducing the self-illumination and for reducing or avoiding absorption of the light from the self-illumination. Overall, they increase the efficiency and the light quality of the light emitted by the component during operation.

BRIEF DESCRIPTION OF THE DRAWINGS

The component described here is explained in greater detail below on the basis of exemplary embodiments and the associated figures.

DETAILED DESCRIPTION

Figure 1:
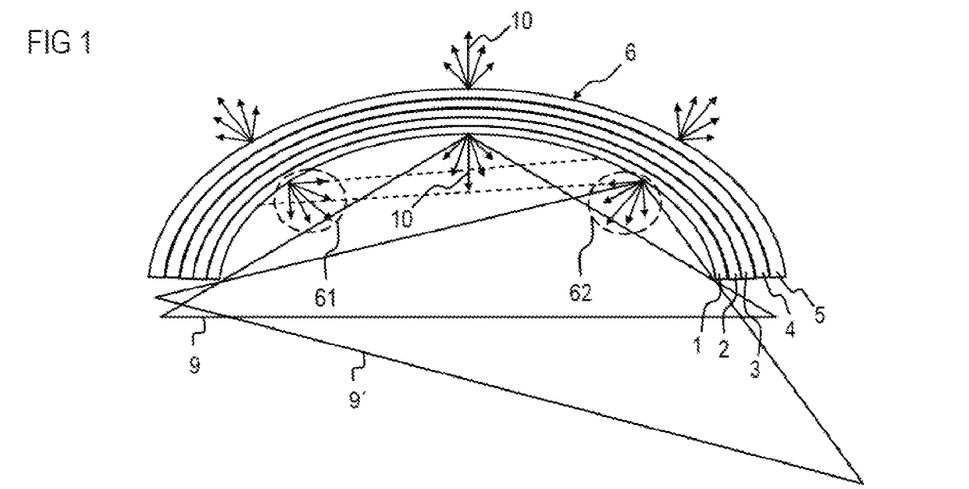
FIG. 1 illustrates a light-emitting organic component comprising two non-planar light exit surfaces.

With reference to FIG. 1 a problem solved by the light-emitting organic component described here is explained in greater detail.

With reference to FIGS. 2, 3, 4, 5 exemplary embodiments of light-emitting organic components described here are explained in greater detail.

Figure 6:
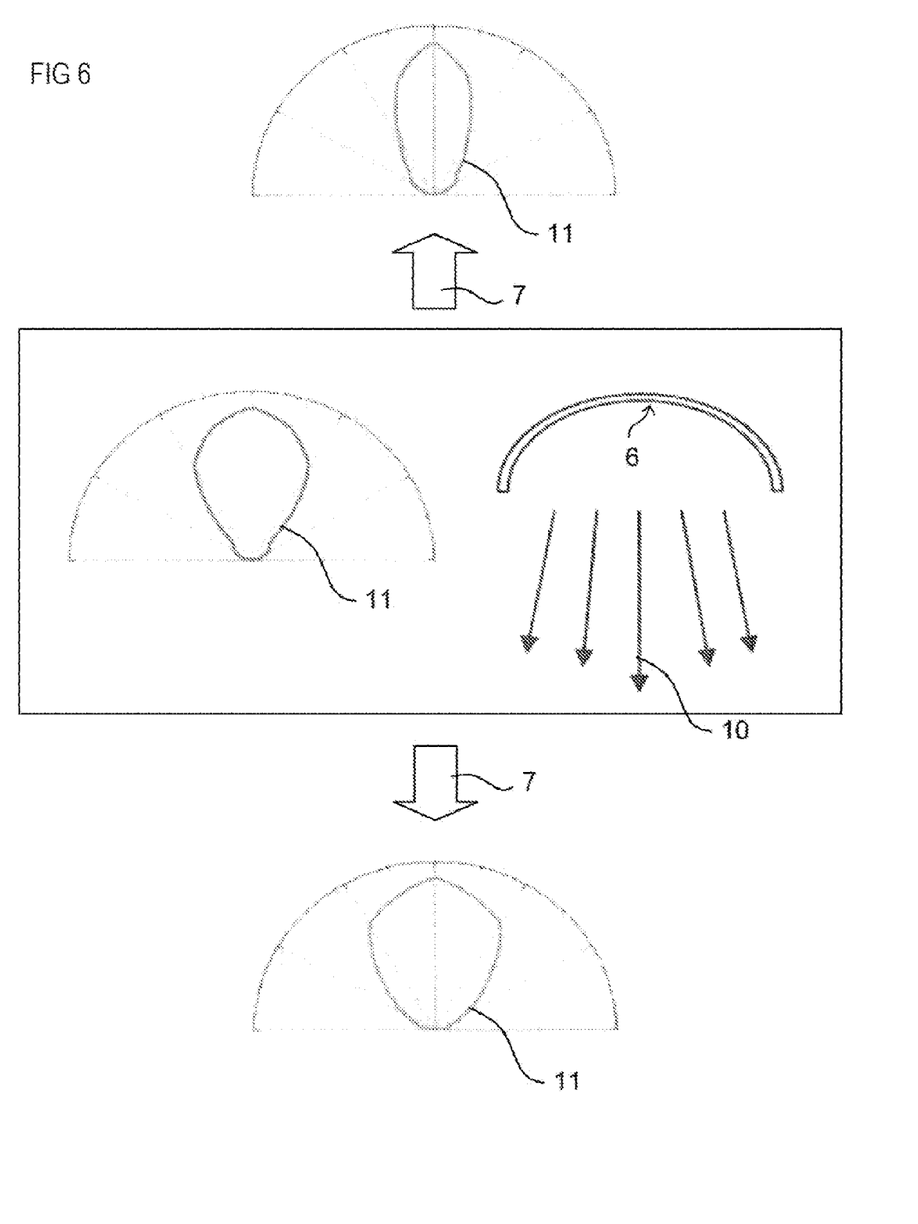
FIG. 6 illustrates another example embodiment of a light-emitting organic component.
Figure 7:
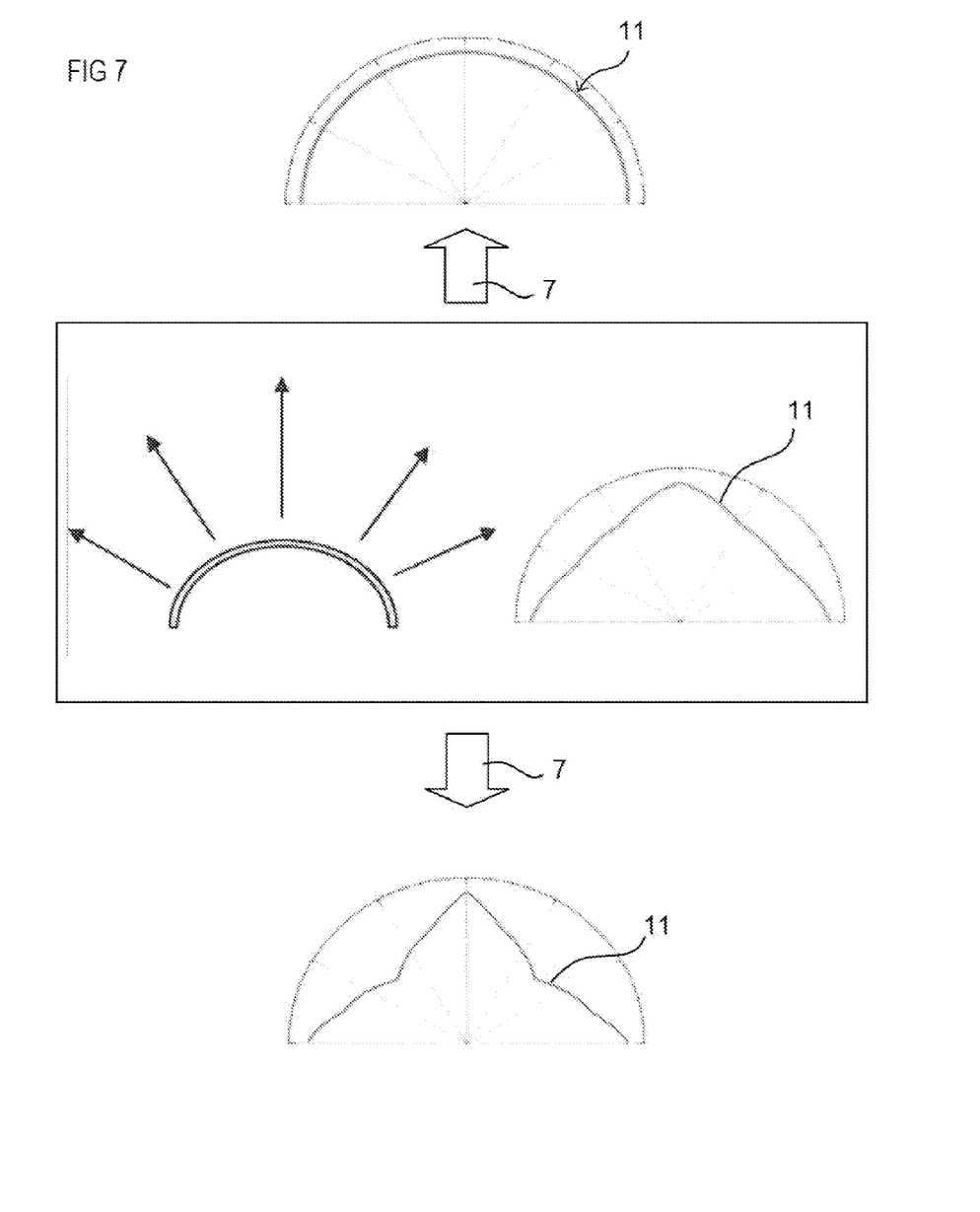
FIG. 7 illustrates another example embodiment of a light-emitting organic component.

With reference to FIGS. 6 and 7 further exemplary embodiments of light-emitting organic components described here are explained.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

FIG. 1 shows a light-emitting organic component comprising two non-planar light exit surfaces 6. The light-emitting organic component comprises a first encapsulation 1. The first encapsulation 1 can be a substrate, for example, to which the subsequent layers of the component are applied. Furthermore, it is possible for the first encapsulation 1 to be an encapsulation layer which at least inhibits the passage of moisture and/or atmospheric gases into the component.

The light-emitting organic component further comprises a first electrode 2, via which a succeeding organic active region 3 can be energized. The organic active region 3 is succeeded by the second electrode 4 at that side of said organic active region which faces away from the first electrode 2. At that side of the second electrode 4 which faces away from the organic active region 3, said second electrode is succeeded by a second encapsulation 5. The second encapsulation 5 can be for example a layer which prevents the passage of moisture and/or atmospheric gases into the component. Alternatively, it is also possible for the second encapsulation 5 to be a substrate, to which the layers of the component, that is to say the electrodes 2, 4 and the organic active layer 3, are applied.

The light-emitting organic component in FIG. 1 emits from two main surfaces. It therefore comprises two light exit surfaces 6. In this case, one of the light exit surfaces is convexly curved, and another of the light exit surfaces is concavely curved. The component in FIG. 1 is, for example, a bent organic light-emitting diode.

Each region 61, 62 at the non-planar light exit surface 6, from which light is emitted, can be assigned an emission cone 9, 9' corresponding, for example, to a full width at half maximum of the intensity of the light emitted in these regions. The emission cones 9, 9' are merely shown schematically in the figures.

The non-planar light exit surfaces 6 of the component in FIG. 1 are free of optical structures and, therefore, the component is embodied in particular in a smooth fashion at its outer surfaces. As can be gathered from FIG. 1, for example for light which leaves the component in a first region 61 of the light exit surface 6, self-illumination or so-called self-irradiation can occur in a second region 62. As a result of the limited reflectivity of the light exit surface, only part of this light can be reflected again. Particularly for light rays which require a plurality of passes as a result of reflections at the light exit surface 6 of the component, a sudden loss of light occurs as a result.

Solutions for avoiding this self-illumination are demonstrated in connection with the following exemplary embodiments of the component described here.

Figure 2:
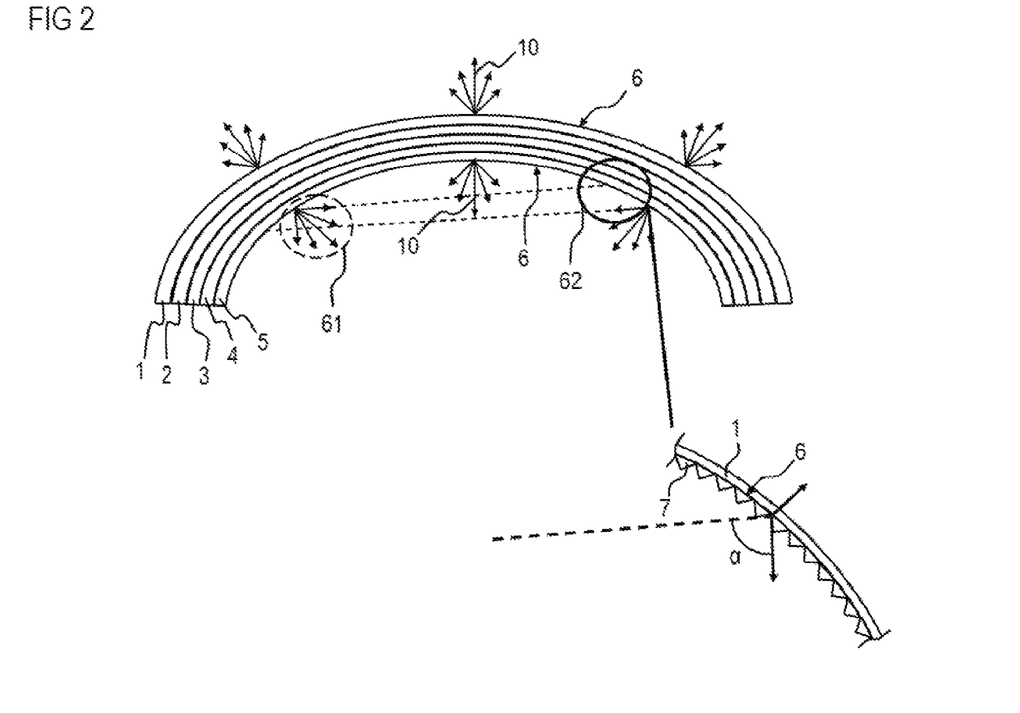
FIG. 2 illustrates an example embodiment of a light-emitting organic component.

FIG. 2 shows a first exemplary embodiment of a light-emitting organic component described here. The self-illumination of the organic component is taken into consideration in this exemplary embodiment. As shown in FIG. 1, the component comprises a non-planar light exit surface 6.

Light emerging from a first region 61 of the non-planar light exit surface 6 is emitted in the direction of a second region 62 of the non-planar light exit side and is directed away from the non-planar light exit side 6 there by optical structures 7. In this case, the optical structures 7 are embodied as prisms in the exemplary embodiment in FIG. 2. On account of this local, optical microstructure, it is possible, in particular, that the light of the self-illumination can emerge from the component after a single reflection. That is to say that the number of required passes until the light can leave the component is minimized. As a result, the efficiency increases since losses as a result of absorption and transmission at the light exit surface 6 are reduced.

The optical structures 7 are microlenses, for example. The size of the optical structures 7, for example the maximum lateral extent thereof, is for example in the range of at least 5 μm and at most 50 μm, in particular in the range of at least 5 μm and at most 15 μm.

The optical structures 7 are present as a foil, for example, which can be applied to the light exit surface 6. The foil can be fixed to the light exit surface 6 for example in an optically non-coupled fashion, for example by adhesive bonding only in the edge region of said light exit surface. An air gap is then formed between the light exit surface 6 and the optical structures 7.

Figure 3:
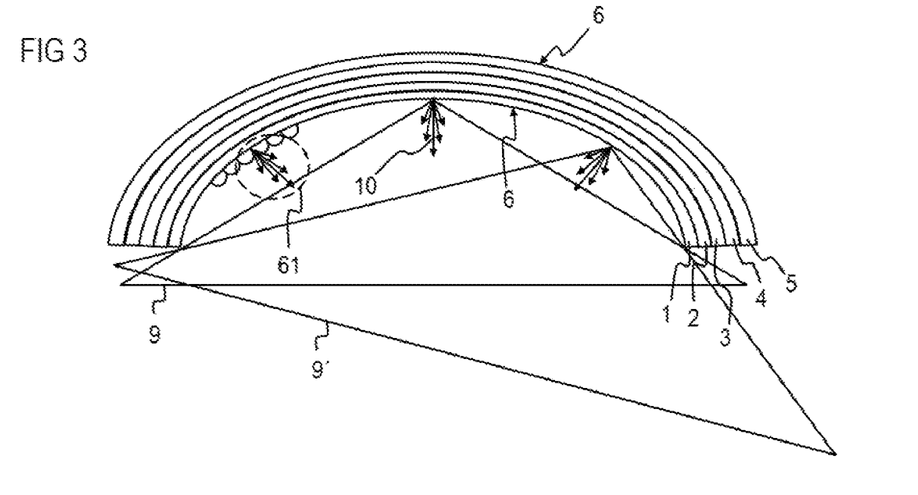
FIG. 3 illustrates another example embodiment of a light-emitting organic component.

A further exemplary embodiment of a light-emitting organic component described here is explained in greater detail in connection with FIG. 3. In this exemplary embodiment, the angular distribution of the intensity of the light emitted by the non-planar light exit surface 6 is set by the optical structures 7. In this case, the angular distribution is reduced over the entire non-planar light exit surface. For this purpose, the same optical structures can be used over the entire light exit surface. FIG. 3 illustrates the optical structures 7 for the first region 61 by way of example. By virtue of the fact that the optical structures 7 reduce the angular distribution in the course of emergence, the probability that light can impinge again on the light exit surface 6 decreases. That is to say that the probability of the self-illumination decreases. The focusing of the light in order to generate a narrower angular distribution can be effected in this case by optical structures embodied as microlenses.

Figure 4:
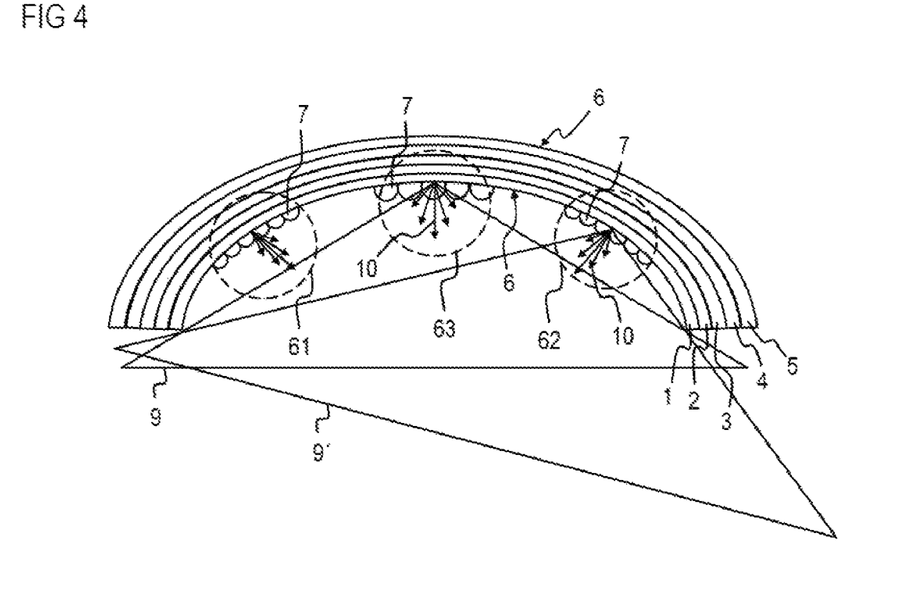
FIG. 4 illustrates another example embodiment of a light-emitting organic component.

In connection with FIG. 4, an exemplary embodiment of a light-emitting organic component described here is shown wherein an angular distribution of the intensity of the light emitted by the non-planar light exit surface 6 is set by the optical structures 7 and varies along the non-planar light exit surface 6. Emission thus takes place in the center of the light exit surface, that is to say for example in the third region 63 with a wide angular distribution, since the risk of self-illumination for light which emerges at this location of the light exit surface 6 is low. A narrower angular distribution is set in edge regions in order to reduce the self-illumination. For this purpose, in first and second regions 61, 62, by way of example, a lens form chosen for the optical structures is different than that chosen in the third region 63. In this case, it is also possible that, by way of example, in the edge regions, that is to say in the first region 61 and in the second region 62, the main emission direction of the light is changed in such a way that the probability of the self-illumination is reduced. By way of example, the main emission direction 10 for light emerging in these regions can be effected away from the center, toward the edges. This is made possible by optical structures 7 embodied asymmetrically.

Figure 5:
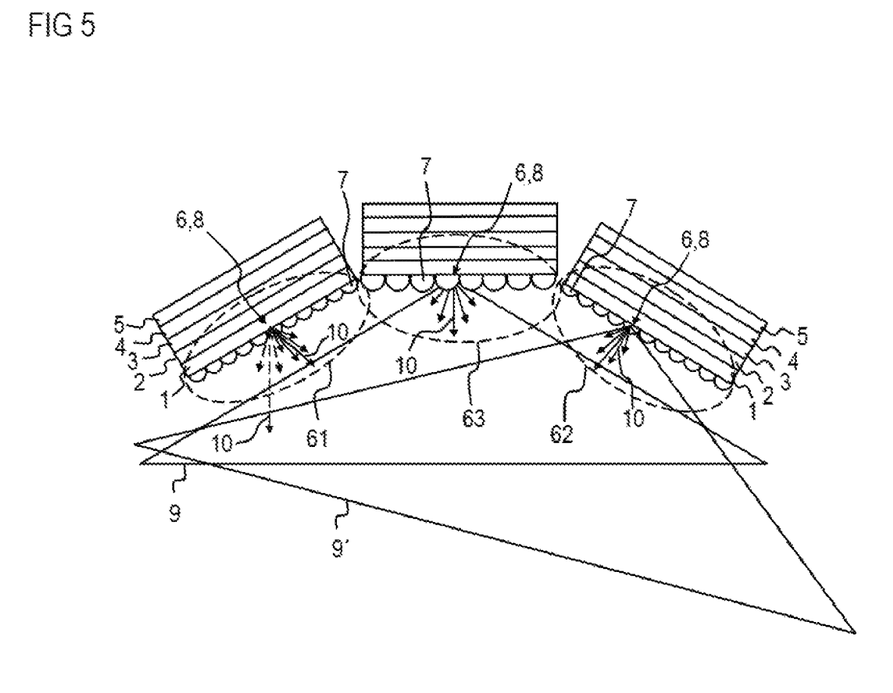
FIG. 5 illustrates another example embodiment of a light-emitting organic component.

In connection with FIG. 5, an exemplary embodiment of a light-emitting organic component described here is shown wherein the non-planar light exit surface comprises a plurality of planar partial surfaces 8, which in turn form the non-planar light exit surface. By way of example, the light-emitting component comprises two or more organic light-emitting diodes, wherein each planar partial surface 8 of the non-planar light exit surface 6 is assigned an organic active region 3.

The form of an arbitrary non-planar light exit surface 6 can then be simulated by means of the spatial arrangement of the planar partial surfaces 8 with respect to one another. For the rest, the same measures for preventing or reducing the self-illumination and for deflecting radiation from the self-illumination as in FIGS. 3 and 4 can be used.

By way of example, FIG. 5 also shows that in the first region 61, for example, the optical structures 7 set the main emission direction 10 in such a way that a self-illumination of the light exit surface 6 is at least reduced. In this case, the main emission direction 10 can be varied along the non-planar light exit surface 6, such that, by way of example, in the third region 63 it runs perpendicularly to the light exit surface 6 and in the first region 61 it forms an angle of less than 90° with the light exit surface 6. The nearer to the geometrical center of the light exit surface 6 the emission then takes place, the nearer the angle between the main emission direction and the non-planar light exit surface 6 is to an angle of 90°.

In connection with FIGS. 6 and 7 the illustration shows that the optical structures 7 can supplement the beam shaping on account of the non-planar light exit surface. In this case, the optical structures 7 can intensify or weaken the effect of the curvature of the non-planar light exit surface 6 on the emission characteristic 11.

In this regard, FIG. 6 shows, for example, that a concave light exit surface 6 leads to a narrowed emission profile 11. By means of corresponding optical structures 7, the emission profile can be narrowed further (see at the top) or widened again (see at the bottom).

A convex non-planar light exit surface 6, such as is shown in FIG. 7, leads to a wide emission characteristic 11, which can be widened further (see at the top) or is narrowed (see at the bottom) by means of additional optical structures 7 at the light exit surface 6.

This patent application claims the priority of German patent application 102012210876.9, the disclosure content of which is hereby incorporated by reference.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A light-emitting organic component comprising:
    an organic active region, in which light is generated during an operation of the light-emitting organic component; and
    a non-planar light exit surface, through which at least part of the light generated in the organic active region emerges from the light-emitting organic component,
    wherein a multiplicity of optical structures are arranged at the non-planar light exit surface and optically influence the light passing through and/or impinging on them,
    wherein the non-planar light exit surface is a concavely and/or convexly curved surface which outwardly delimits the light-emitting organic component, wherein an angular distribution of an intensity of the light emitted by the non-planar light exit surface is set by the optical structures, wherein the angular distribution of the intensity becomes narrower toward edges of the non-planar light exit surface, in such a way that a self-illumination of the non-planar light exit surface with light generated in the organic active region is reduced or prevented, and wherein at different locations of the non-planar light exit surface, the optical structures are embodied differently with respect to one another, thus resulting in different optical influencing of the light passing through and/or impinging on them.

2. The light-emitting organic component according to claim 1, wherein a main emission direction of the light emitted by the non-planar light exit surface is set by the optical structures and varies along the non-planar light exit surface in such a way that the self-illumination of the non-planar light exit surface is reduced or prevented.

3. The light-emitting organic component according to claim 1, wherein the non-planar light exit surface comprises at least two planar partial surfaces.

4. The light-emitting organic component according to claim 3 comprising at least two organic active regions, wherein each organic active region is assigned a planar partial surface.

5. The light-emitting organic component according to claim 1, wherein light emerging from a first region of the non-planar light exit surface is emitted in a direction of a second region of the non-planar light exit surface and is directed away from the non-planar light exit surface by the optical structures in the second region.

6. The light-emitting organic component according to claim 1, wherein an angular distribution of the intensity and/or of the color of the light emitted by the non-planar light exit surface is set by the optical structures.

7. The light-emitting organic component according to claim 6, wherein the angular distribution of the intensity and/or of the color varies along the non-planar light exit surface.

8. The light-emitting organic component according to claim 1, wherein a main emission direction of the light emitted by the non-planar light exit surface is set by the optical structures and varies along the non-planar light exit surface.

9. The light-emitting organic component according to claim 8, wherein the main emission direction varies in such a way that the self-illumination of the non-planar light exit surface is at least reduced.

10. The light-emitting organic component according to claim 1, wherein the optical structures comprise at least one of the following optical elements: prism, lens, light-scattering structures.

11. The light-emitting organic component according to claim 1, wherein the optical structures are present as a foil which is applied to the non-planar light exit surface, wherein the foil is fixed to the non-planar light exit surface only in an edge region of said non-planar light exit surface and an air gap is formed between the non-planar light exit surface and the optical structures.

12. A light-emitting organic component comprising:
an organic active region, in which light is generated during an operation of the component; and
a non-planar light exit surface, through which at least part of the light generated in the organic active region emerges from the component,
wherein a multiplicity of optical structures are arranged at the non-planar light exit surface and optically influence the light passing through and/or impinging on them,
wherein an intensity of the light emitted by the non-planar light exit surface is set by the optical structures,
wherein in a third region in a center of the non-planar light exit surface the intensity has a wide angular distribution,
wherein in first and second regions in edge regions of the non-planar light exit surface the intensity has a narrower angular distribution as in the third region, and
wherein a lens form for the optical structures is different for the third region than for the first region and the second region.

13. The light-emitting organic component according to claim 12, wherein the optical structures are present as a foil which is applied to the non-planar light exit surface, wherein the foil is fixed to the non-planar light exit surface only at said edges of said non-planar light exit surface and an air gap is formed between the non-planar light exit surface and the optical structures.

* * * * *